(12) United States Patent
Cheng et al.

(10) Patent No.: US 8,749,411 B2
(45) Date of Patent: Jun. 10, 2014

(54) ANALOG-TO-DIGITAL CONVERSION DEVICE AND METHOD THEREOF

(71) Applicants: Yen-Chien Cheng, Hsinchu (TW); Yung-Chi Yang, Hsinchu (TW); Chien-Yi Wu, Hsinchu (TW)

(72) Inventors: Yen-Chien Cheng, Hsinchu (TW); Yung-Chi Yang, Hsinchu (TW); Chien-Yi Wu, Hsinchu (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 0 days.

(21) Appl. No.: 13/746,312

(22) Filed: Jan. 22, 2013

(65) Prior Publication Data

US 2013/0194119 A1 Aug. 1, 2013

(30) Foreign Application Priority Data

Jan. 30, 2012 (TW) .............................. 101102901 A

(51) Int. Cl.
*H03M 1/06* (2006.01)
(52) U.S. Cl.
USPC ............................. 341/118; 341/120; 341/155

(58) Field of Classification Search
USPC .......................................... 341/118, 120, 155
See application file for complete search history.

(56) References Cited

U.S. PATENT DOCUMENTS

| 5,196,851 | A  | * | 3/1993 | Patel et al. | ..................... 341/140 |
| 5,248,970 | A  | * | 9/1993 | Sooch et al. | .................. 341/120 |
| 7,414,553 | B1 | * | 8/2008 | Tsyrganovich | ............... 341/118 |

* cited by examiner

*Primary Examiner* — Khai M Nguyen
(74) *Attorney, Agent, or Firm* — Jianq Chyun IP Office

(57) ABSTRACT

An analog-to-digital conversion device and a method thereof are provided. The analog-to-digital conversion device includes a first level adjustment unit, an analog-to-digital converter (ADC), and a linear range detection unit. The ADC converts a test signal or a first input signal to generate a test data stream or a first output data stream. In an adjustment mode, the linear range detection unit obtains a conversion curve of the ADC by using the test data stream and determines whether to adjust offset control information according to a linear range of the conversion curve. In an operation mode, the linear range detection unit continues outputting the offset control information. Additionally, before transmitting the first input signal, the first level adjustment unit adjusts a direct-current level of the first input signal according to the offset control information to allow the first input signal to be within the linear range of the conversion curve.

12 Claims, 5 Drawing Sheets

ANALOG-TO-DIGITAL CONVERSION DEVICE AND METHOD THEREOF

CROSS-REFERENCE TO RELATED APPLICATION

This application claims the priority benefit of Taiwan application serial no. 101102901, filed on Jan. 30, 2012. The entirety of the above-mentioned patent application is hereby incorporated by reference herein and made a part of this specification.

BACKGROUND OF THE INVENTION

1. Field of the Invention

The invention generally relates to a conversion device and a method thereof, and more particularly, to an analog-to-digital conversion device and a method thereof.

2. Description of Related Art

In an optical storage system, an optical pick-up head detects radio frequency (RF) signals and servo signals reflected by the surface of an optical disc. In addition, the RF signals and the servo signals are processed by an analog front-end (AFE) and converted into digital information by an analog-to-digital converter (ADC), so as to be processed by a read channel and a digital front-end (DFE). Herein the read channel may be a partial response maximum likelihood (PRML) circuit. In the procedure described above, the ADC is a critical device. The processing result of the PRML circuit and the DFE will be affected if distortion is produced in the conversion procedure.

FIG. 1A is a diagram illustrating an ideal conversion curve of an ADC. As shown in FIG. 1A, along with the increase of the analog voltage, the digital codes converted by the ADC present a monotonic increase. Strictly speaking, the ADC is only considered as an ideal ADC when the integral nonlinearity (INL) error and the differential nonlinearity (DNL) error of the ADC are zero. Thus, in an ideal analog-to-digital conversion situation, when an analog sine wave is input, the obtained digital codes present a curve similar to the sine wave.

However, in an actual application, the conversion curve of an ADC may present a non-monotonic increase. FIG. 1B is a diagram illustrating a non-ideal conversion curve of an ADC. As shown in FIG. 1B, when an analog sine wave is input, the obtained digital codes are distorted and accordingly cannot present a curve similar to the sine wave. In this case, the distorted digital codes will affect the disc reading performance of the optical storage system or reduce the error correction capability thereof. In an even worse case, a servo control failure may be caused and the optical storage system may not be able to read a disc.

SUMMARY OF THE INVENTION

Accordingly, the invention is directed to an analog-to-digital conversion device, in which a linear range of a conversion curve is detected by using a linear range detection unit and an input signal is adjusted to be within the linear range of the conversion curve, so that digital signal deformation and distortion is avoided.

The invention is directed to an analog-to-digital conversion method, in which an input signal is adjusted to be within a linear range of a conversion curve by using an offset control information before the input signal is converted, so that it is ensured that an output data stream converted from the input signal won't cause signal deformation or distortion.

The invention provides an analog-to-digital conversion device including a first level adjustment unit, an analog-to-digital converter, and a linear range detection unit. The first level adjustment unit transmits a test signal in an adjustment mode and transmits a first input signal in an operation mode. The ADC converts the test signal or the first input signal to generate a test data stream or a first output data stream. In the adjustment mode, the linear range detection unit obtains a conversion curve of the ADC by using the test data stream and determines whether to adjust an offset control information according to a linear range of the conversion curve. Additionally, in the operation mode, the linear range detection unit continues to output the offset control information. Before transmitting the first input signal, the first level adjustment unit further adjusts a direct-current (DC) level of the first input signal according to the offset control information to allow the first input signal to be within the linear range of the conversion curve.

According to an embodiment of the invention, the linear range detection unit includes a range detector, a controller, and an offset adjuster. In the adjustment mode, the range detector records a plurality of digital codes in the test data stream according to a plurality of analog voltages corresponding to the test signal to obtain the conversion curve and detects the linear range of the conversion curve to generate a regional information. In the adjustment mode, the controller determines whether to generate an adjustment information according to the regional information, and in the operation mode, the controller generates an operation information. In the adjustment mode, the offset adjuster determines whether to adjust the offset control information according to whether the adjustment information is generated or not, and in the operation mode, the offset adjuster continues to output the offset control information according to the operation information.

According to an embodiment of the invention, the linear range detection unit further includes a digital waveform generator. The digital waveform generator generates a reference data stream in the adjustment mode, and the first level adjustment unit receives the reference data stream and converts the reference data stream into the test signal.

According to an embodiment of the invention, the analog-to-digital conversion device further includes a second level adjustment unit and a multiplexer. In the operation mode, the second level adjustment unit adjusts a DC level of a second input signal according to the offset control information to allow the second input signal to be within the linear range of the conversion curve and transmits the second input signal. In the operation mode, the multiplexer outputs one of the first input signal and the second input signal. When the multiplexer outputs the first input signal, the ADC converts the first input signal into the first output data stream. When the multiplexer outputs the second input signal, the ADC converts the second input signal into a second output data stream.

The invention also provides an analog-to-digital conversion method adapted to an analog-to-digital conversion device. The analog-to-digital conversion method includes following steps. In an adjustment mode, a test signal is transmitted and converted into a test data stream. A conversion curve is obtained by using the test data stream, and whether an offset control information is adjusted is determined according to a linear range of the conversion curve. In an operation mode, a DC level of a first input signal is adjusted according to the offset control information, so as to allow the first input signal to be within the linear range of the conversion curve. Besides, the first input signal is transmitted and converted into a first output data stream.

As described above, in the invention, a linear range of a conversion curve is determined, and an offset control information is controlled according to the linear range of the conversion curve. When an input signal is to be converted, the input signal is adjusted to be within the linear range of the conversion curve by using the offset control information before it is converted. Thereby, it is ensured that an output data stream converted from the input signal won't cause signal deformation or distortion.

These and other exemplary embodiments, features, aspects, and advantages of the invention will be described and become more apparent from the detailed description of exemplary embodiments when read in conjunction with accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
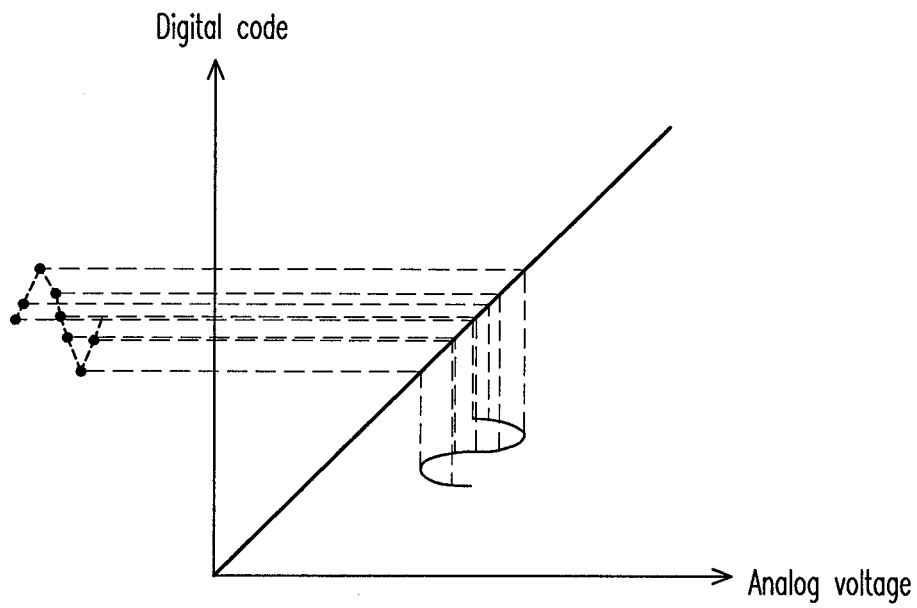
FIG. 1A is a diagram illustrating an ideal conversion curve of an analog-to-digital converter (ADC).
Figure 1B:
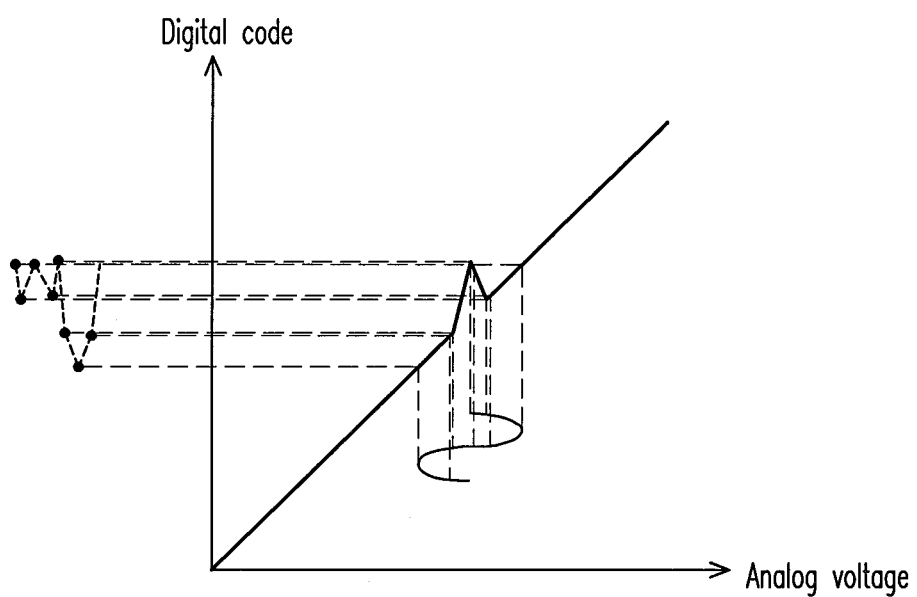
FIG. 1B is a diagram illustrating a non-ideal conversion curve of an ADC.

Reference will now be made in detail to the present preferred embodiments of the invention, examples of which are illustrated in the accompanying drawings. Wherever possible, the same reference numbers are used in the drawings and the description to refer to the same or like parts.

Figure 2:
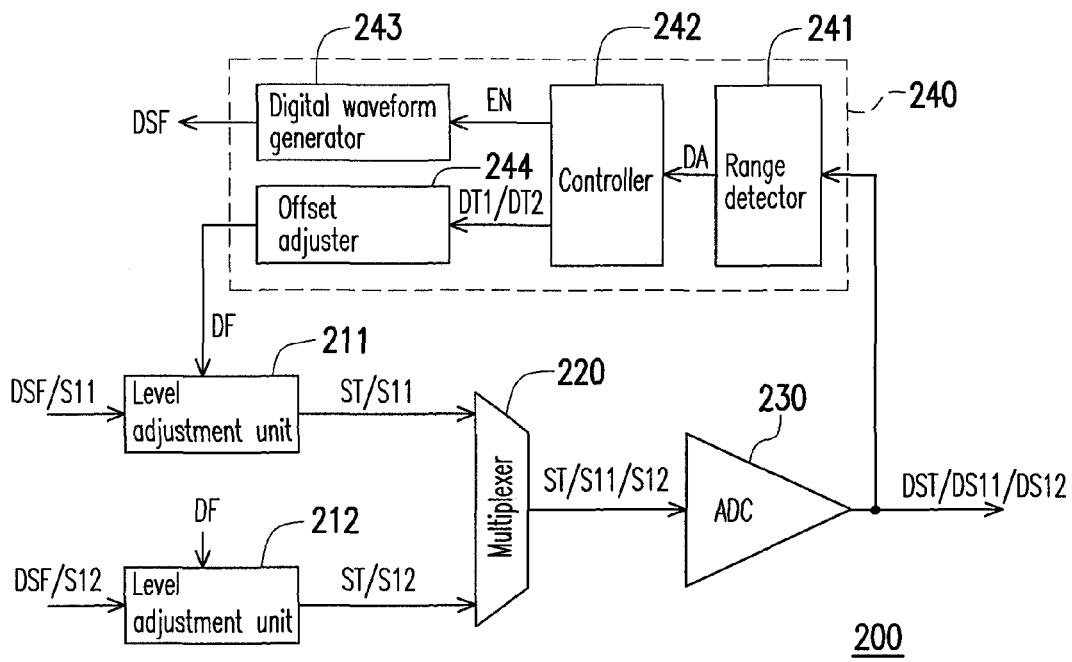
FIG. 2 is a diagram of an analog-to-digital conversion device according to an embodiment of the invention.

FIG. 2 is a diagram of an analog-to-digital conversion device according to an embodiment of the invention. Referring to FIG. 2, the analog-to-digital conversion device 200 includes the first level adjustment unit 211 and the second level adjustment unit 212, a multiplexer 220, an analog-to-digital converter (ADC) 230, and a linear range detection unit 240. The multiplexer 220 is electrically connected between the output terminals of the level adjustment units 211-212 and the input terminal of the ADC 230 and configured to outputs one of the signals from the level adjustment units 211-212 to the ADC 230. The linear range detection unit 240 is electrically connected between the output terminal of the ADC 230 and the input terminals of the first level adjustment unit 211 and the second level adjustment unit 212 and configured to provide an offset control information DF to the first level adjustment unit 211 and the second level adjustment unit 212.

The analog-to-digital conversion device 200 has an adjustment mode and an operation mode, and the analog-to-digital conversion device 200 is operated in the adjustment mode at first, and then operated in the operation mode. In the adjustment mode, two identical or different test signals ST are transmitted to the multiplexer 220 by the first level adjustment unit 211 and the second level adjustment unit 212, wherein the test signals ST may be ramp waves, triangular waves, sawtooth waves, or sine waves. The multiplexer 220 outputs one of the two test signals ST to the ADC 230. The ADC 230 converts the test signal ST into a test data stream DST. In the adjustment mode, the linear range detection unit 240 obtains a conversion curve of the ADC 230 by using the test data stream DST and determines whether to adjust the offset control information DF according to a linear range of the conversion curve. In other words, in the adjustment mode, the analog-to-digital conversion device 200 detects the linear range of the conversion curve of the ADC 230 through the linear range detection unit 240 and controls the offset control information DF according to the linear range of the conversion curve of the ADC 230.

On the other hand, in the operation mode, the linear range detection unit 240 stops the detection operation and continues outputting the offset control information DF obtained in the adjustment mode. In addition, herein the first level adjustment unit 211 and the second level adjustment unit 212 receive input signals S11-S12 and transmit the input signals S11-S12 to the multiplexer 220. It should be noted that before transmitting the input signals S11-S12, the first level adjustment unit 211 and the second level adjustment unit 212 adjust the DC levels of the input signals S11-S12 according to the offset control information DF, so as to allow the input signals S11-S12 to be within the linear range of the conversion curve of the ADC 230. Moreover, the multiplexer 220 outputs one of the input signals S11-S12 to the ADC 230.

When the input signal S11 is output, the ADC 230 converts the input signal S11 into a corresponding output data stream DS11. Contrarily, when the input signal S12 is output, the ADC 230 converts the input signal S12 into a corresponding output data stream DS12. It should be mentioned that because the input signals S11-S12 are both adjusted to be within the linear range of the conversion curve of the ADC 230, no distortion will be produced in the output data streams DS11 and DS12 output by the ADC 230. In other words, in the operation mode, the analog-to-digital conversion device 200 adjusts the DC levels of the input signals S11-S12 by using the offset control information DF in order to prevent distortion in the output data stream generated by the ADC 230.

In order to allow those having ordinary knowledge in the art to better understand the invention, the internal structure of the linear range detection unit 240 will be further described below. Referring to FIG. 2, the linear range detection unit 240 includes a range detector 241, a controller 242, a digital waveform generator 243, and an offset adjuster 244. The range detector 241 is electrically connected to the output terminal of the ADC 230. The controller 242 is electrically connected to the output terminal of the range detector 241. The digital waveform generator 243 and the offset adjuster 244 are electrically connected to the first level adjustment unit 211 and the second level adjustment unit 212.

A plurality of analog voltages corresponding to the test signals ST is stored in the range detector 241 in advance. In the adjustment mode, the range detector 241 records a plurality of digital codes in the test data stream DST according to aforementioned analog voltages, so as to obtain the conversion curve of the ADC 230. In an actual application, a non-ideal situation may be produced on the conversion curve of the ADC 230. Thus, the range detector 241 further detects a linear range of the conversion curve.

Figure 3A:
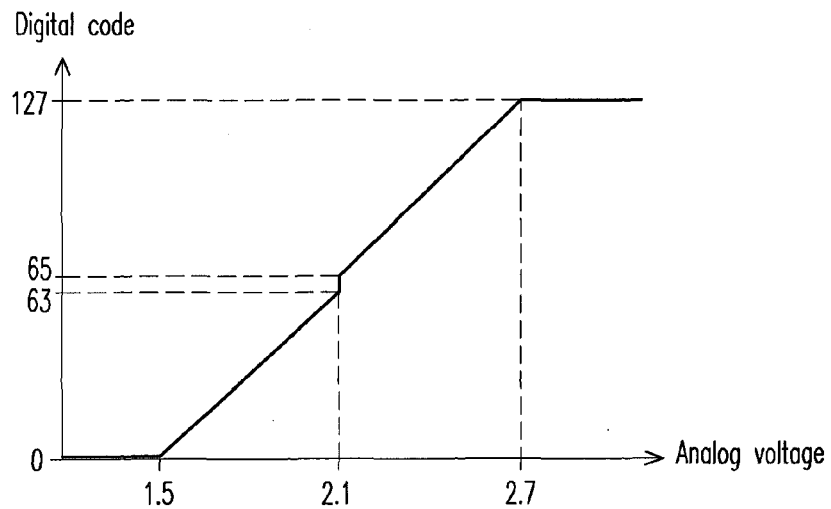
FIGS. 3A-3C are respectively diagrams of conversion curves according to an embodiment of the invention.
Figure 3B:
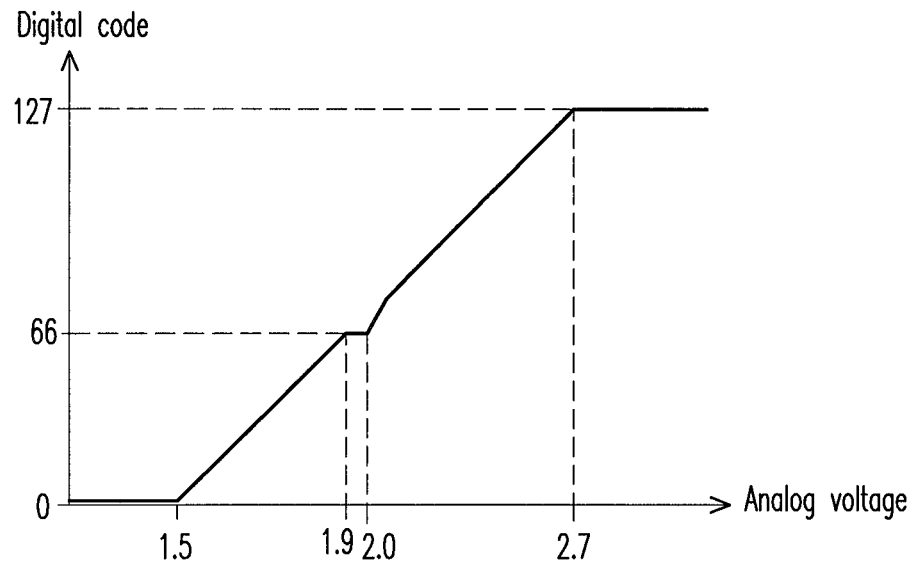
Figure 3C:
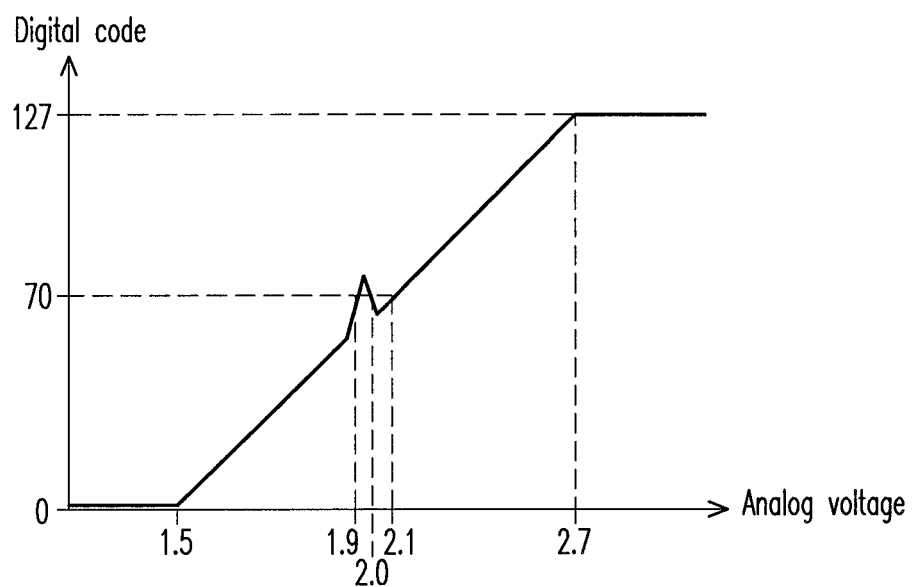

FIGS. 3A-3C are respectively diagrams of conversion curves according to an embodiment of the invention, wherein the axis X represents the analog voltages corresponding to the test signals ST, and the axis Y represents the digital codes in the test data stream DST. As shown in FIGS. 3A-3C, the three most common non-ideal situations of a conversion curve are code missing, bad integration/DNL error, and non-monotonic curve.

Referring to FIG. 3A, in a situation with missing code, a specific digital code output by the ADC 230 does not appear at all. For example, in FIG. 3A, when the analog voltages remain at 2.1V, the digital codes vary between 63 and 65 and accordingly a glitch effect is produced. In order to avoid such a situation, the range detector 241 determines whether at least one specific digital code among aforementioned digital codes does not appear. If at least one specific digital code does not appear, the range detector 241 defines a non-linear range of the conversion curve by using the at least one specific digital code and then defines the linear range of the conversion curve by using the non-linear range.

Referring to FIG. 3B, in a situation with the INL/DNL error, all the digital codes appear but several analog voltages are corresponding to the same digital code. For example, in FIG. 3B, the analog voltages 1.9V and 2.0V are all corresponding to the digital code 66. In order to avoid such a situation, the range detector 241 determines whether at least one specific digital code among the digital codes stays for over a predetermined time. If at least one specific digital code stays for over the predetermined time, the range detector 241 defines a non-linear range of the conversion curve by using the at least one specific digital code and then defines the linear range of the conversion curve by using the non-linear range.

Referring to FIG. 3C, in a non-monotonic curve, one digital code may corresponding to multiple analog voltages. For example, in FIG. 3C, the digital code 70 may be corresponding to 3 analog voltages 1.9V, 2.0V, and 2.1V. In order to avoid such a situation, the range detector 241 determines whether the conversion curve has a negative slope. When the conversion curve has a negative slope, the range detector 241 defines a non-linear range of the conversion curve by using the digital codes for forming the negative slope among the digital codes and then defines the linear range of the conversion curve by using the non-linear range.

In other words, in the adjustment mode, the range detector 241 determines whether at least one specific digital code does not appear or stay for over a predetermined time and determines whether the conversion curve has a negative slope, so as to detect the linear range of the conversion curve. In addition, the range detector 241 generates a corresponding regional information DA according to the detected linear range, and the controller 242 determines whether to generate an adjustment information DT1 according to the regional information DA. Herein the controller 242 can determine whether the conversion curve presents a monotonic increase according to the regional information DA. Additionally, when the controller 242 determines that the conversion curve does not present a monotonic increase, the controller 242 generates the adjustment information DT1. Contrarily, when the controller 242 determines that the conversion curve does present a monotonic increase, the controller 242 does not generate the adjustment information DT1.

Figure 4A:
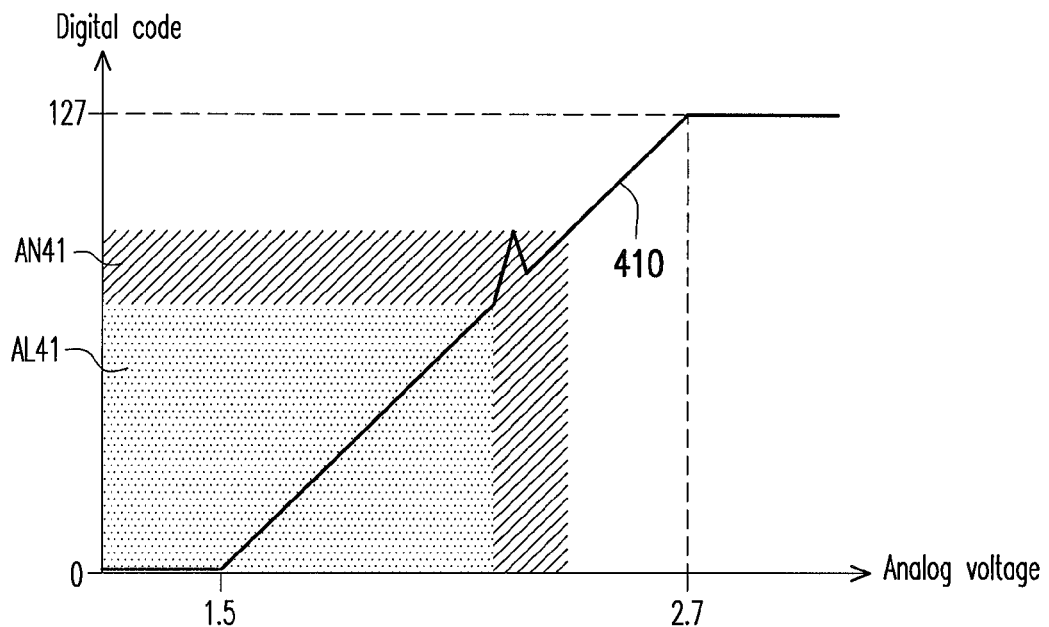
FIG. 4A and FIG. 4B are respectively diagrams of conversion curves according to another embodiment of the invention.
Figure 4B:
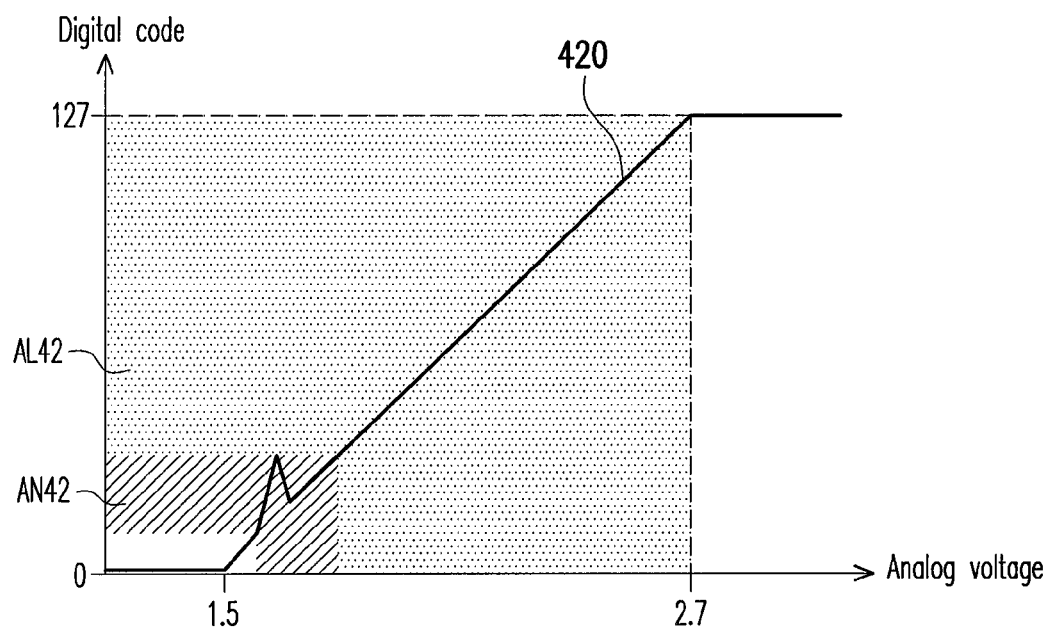

FIG. 4A and FIG. 4B are respectively diagrams of conversion curves according to another embodiment of the invention. As shown in FIG. 4A and FIG. 4B, through the range detector 241, the conversion curve 410 or 420 is obtained, and the linear range AL41 of the conversion curve 410 or the linear range AL42 of the conversion curve 420 is further detected, wherein AN41 and AN42 are respectively the non-linear ranges of the conversion curves 410 and 420. Herein the controller 242 determines that the linear range of the conversion curve 410 or 420 does not cover the entire conversion curve according to the regional information DA and accordingly further determines that the conversion curve 410 or 420 does not present a monotonic increase. Thus, the controller 242 generates the corresponding adjustment information DT1.

Thereby, in the adjustment mode, when the adjustment information DT1 is generated, the offset adjuster 244 adjusts the offset control information DF according to the adjustment information DT1. Contrarily, when the adjustment information DT1 is not generated, the offset adjuster 244 keeps the offset control information DF at the last value of the control information DF in the adjustment mode. The initial value of the offset control information DF may be set up according to the center point of the conversion curve. On the other hand, in the operation mode, the range detector 241 stops detecting the linear range of the conversion curve, and the controller 242 generates an operation information DT2. Thus, in the operation mode, the offset adjuster 244 continues outputting the offset control information DF obtained in the adjustment mode according to the operation information DT2.

It should be mentioned that in the embodiment illustrated in FIG. 2, the test signals ST are generated by the digital waveform generator 243 in the linear range detection unit 240. To be specific, in the adjustment mode, the controller 242 generates an enabling information EN for the digital waveform generator 243. Accordingly, the digital waveform generator 243 generates a reference data stream DSF. Besides, the first level adjustment unit 211 and the second level adjustment unit 212 receive the reference data stream DSF and convert the digital reference data stream DSF into the analog test signals ST. Moreover, in the adjustment mode, the first level adjustment unit 211 and the second level adjustment unit 212 further transmit the test signals ST to the multiplexer 220. But, in the operation mode, the controller 242 would not send the enabling information EN to the digital waveform generator 243.

Figure 5:
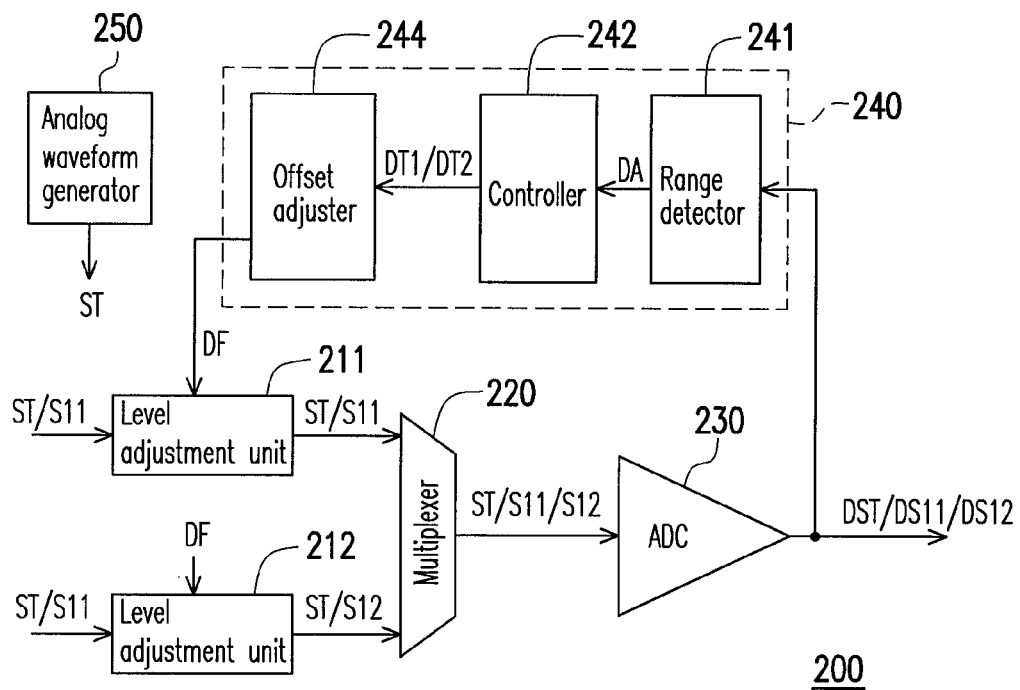
FIG. 5 is a diagram of an analog-to-digital conversion device according to another embodiment of the invention.

Additionally, the test signals ST may also be directly provided by an analog waveform generator or an external waveform generator. FIG. 5 is a diagram of an analog-to-digital conversion device according to another embodiment of the invention. Referring to both FIG. 2 and FIG. 5, the major difference between the two analog-to-digital conversion devices is that the analog-to-digital conversion device 200 in FIG. 5 further includes an analog waveform generator 250 and no digital waveform generator is disposed in the linear range detection unit 240. Thus, in the embodiment illustrated in FIG. 5, the analog waveform generator 250 directly provides the test signals ST to the level adjustment units 211 and 212 in the adjustment mode so that the digital waveform generator 243 can transmit the test signals ST to the multiplexer 220.

In an actual application, the analog-to-digital conversion device 200 can be applied to an optical storage system and configured to convert RF signals from a read channel and servo signals from a servo channel in the optical storage system. During the initialization of the optical storage system, a laser diode in the optical storage system is turned off, an optical pick-up head is moved to the bottom so that it won't be affected by reflected signals in the system, and the analog-to-digital conversion device 200 is switched to the adjustment mode. Thereby, during the initialization of the optical storage system, the analog-to-digital conversion device 200 also detects the linear range of the conversion curve of the ADC 230.

Thereby, when the optical storage system works normally, the analog-to-digital conversion device 200 is correspondingly switched to the operation mode to respectively receive a RF signal and a servo signal through the digital waveform generator 243. Herein the RF signal and the servo signal are equivalent to aforementioned input signals S11-S12. In other words, when the optical storage system works normally, the digital waveform generator 243 respectively adjust the RF signal and the servo signal to allow them to be within the linear range of the conversion curve of the ADC 230. Thus, the output data stream of the optical storage system converted by the analog-to-digital conversion device 200 does not cause any signal deformation or distortion, and accordingly the disc reading capability of the optical storage system and the quality of the servo control signal are improved.

In an actual application, if the analog-to-digital conversion device 200 needs only convert signals from a single channel, those having ordinary knowledge in the art may also remove the level adjustment unit 212 and the multiplexer 220 from the analog-to-digital conversion device 200 according to the design requirement. In this case, the analog-to-digital conversion device 200 can still adjust a signal from the single channel to allow it to be within the linear range of the conversion curve and then convert the signal from the single channel. In other words, the analog-to-digital conversion devices 200 disclosed in the embodiments illustrated in FIG. 2 and FIG. 5 are not intended to limit the scope of the invention, and those having ordinary knowledge in the art can selectively remove the level adjustment unit 212 and the multiplexer 220 according to the design requirement.

Figure 6:
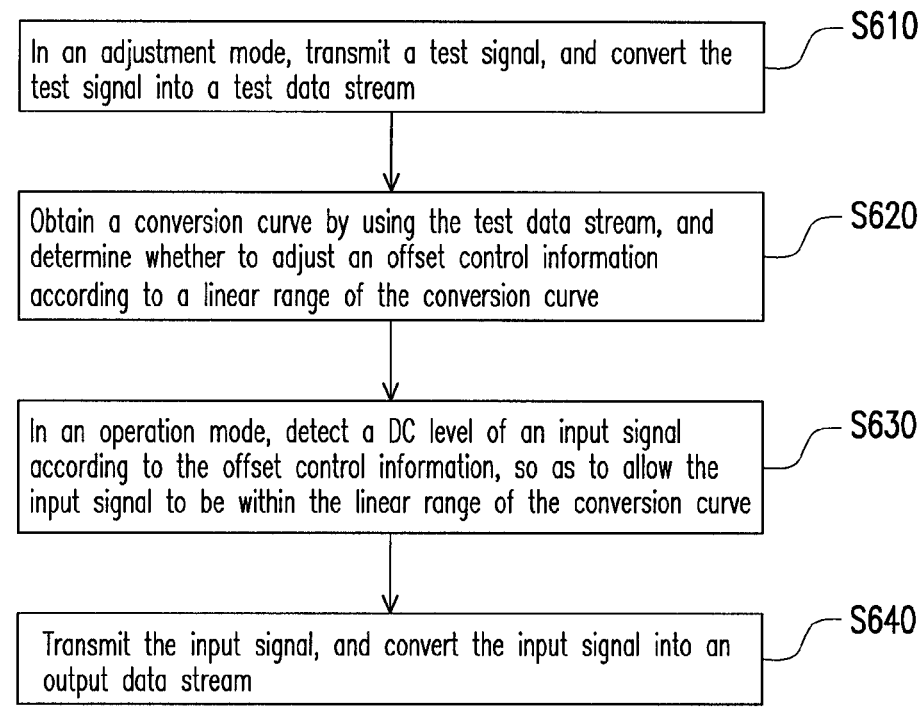
FIG. 6 is a flowchart of an analog-to-digital conversion method according to an embodiment of the invention.

FIG. 6 is a flowchart of an analog-to-digital conversion method according to an embodiment of the invention. The analog-to-digital conversion method is adapted to an analog-to-digital conversion device. Referring to FIG. 6, in step S610, a test signal is transmitted and converted into a test data stream in an adjustment mode. Then, in step S620, a conversion curve is obtained by using the test data stream, and whether to adjust an offset control information is determined according to a linear range of the conversion curve. In other words, in the adjustment mode, the linear range of the conversion curve is detected, and the offset control information is controlled according to the linear range of the conversion curve. In step S630, in an operation mode, a DC level of an input signal is adjusted according to the offset control information, so as to allow the input signal to be within the linear range of the conversion curve. In step S640, the input signal is transmitted and converted into an output data stream. In other words, in the operation mode, the input signal is adjusted according to the offset control information so that no distortion will be produced in the output data stream. Details of the analog-to-digital conversion method in the present embodiment have been described in foregoing embodiments therefore will not be described herein.

In summary, according to the invention, a linear range of a conversion curve is first detected and an offset control information is then controlled according to the linear range of the conversion curve. Thus, when an input signal is to be converted, the input signal is first adjusted to be within the linear range of the conversion curve by using the offset control information and then converted. Thereby, it is ensured that the output data stream obtained by converting the input signal won't cause any signal deformation or distortion.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An analog-to-digital conversion device, comprising:
a first level adjustment unit, transmitting a test signal in an adjustment mode, and transmitting a first input signal in an operation mode;
an analog-to-digital converter (ADC), converting the test signal or the first input signal to generate a test data stream or a first output data stream; and
a linear range detection unit, wherein in the adjustment mode, the linear range detection unit obtains a conversion curve of the ADC by using the test data stream and determines whether to adjust an offset control information according to a linear range of the conversion curve, and in the operation mode, the linear range detection unit continues to output the offset control information,
wherein before transmitting the first input signal, the first level adjustment unit adjusts a direct-current (DC) level of the first input signal according to the offset control information to allow the first input signal to be within the linear range of the conversion curve.

2. The analog-to-digital conversion device according to claim 1, wherein the linear range detection unit comprises:
a range detector, wherein in the adjustment mode, the range detector records a plurality of digital codes in the test data stream according to a plurality of analog voltages corresponding to the test signal to obtain the conversion curve and detects the linear range of the conversion curve to generate a regional information;
a controller, wherein in the adjustment mode, the controller determines whether to generate an adjustment information according to the regional information, and in the operation mode, the controller generates an operation information; and
an offset adjuster, wherein in the adjustment mode, the offset adjuster determines whether to adjust the offset control information according to whether the adjustment information is generated or not, and in the operation mode, the offset adjuster continues to output the offset control information according to the operation information.

3. The analog-to-digital conversion device according to claim 2, wherein the range detector determines whether at least one specific digital code among the digital codes does not appear or stay for over a predetermined time, and the range detector determines whether the conversion curve has a negative slope to detect the linear range of the conversion curve.

4. The analog-to-digital conversion device according to claim 2, wherein the linear range detection unit further comprises:
a digital waveform generator, generating a reference data stream in the adjustment mode, wherein the first level adjustment unit receives the reference data stream and converts the reference data stream into the test signal.

5. The analog-to-digital conversion device according to claim 1 further comprising:
an analog waveform generator, generating the test signal in the adjustment mode.

6. The analog-to-digital conversion device according to claim 1 further comprising:
a second level adjustment unit, wherein in the operation mode, the second level adjustment unit adjusts a DC level of a second input signal according to the offset control information to allow the second input signal to be within the linear range of the conversion curve, and the second level adjustment unit transmits the second input signal; and a multiplexer, outputting one of the first input signal and the second input signal in the operation mode, wherein when the multiplexer outputs the first input signal, the ADC converts the first input signal into the first output data stream, and when the multiplexer outputs the second input signal, the ADC converts the second input signal into a second output data stream.

7. An analog-to-digital conversion method, adapted to an analog-to-digital conversion device, the analog-to-digital conversion method comprising:

in an adjustment mode, transmitting a test signal and converting the test signal into a test data stream;

obtaining a conversion curve by using the test data stream, and determining whether to adjust an offset control information according to a linear range of the conversion curve;

in an operation mode, adjusting a DC level of a first input signal according to the offset control information to allow the first input signal to be within the linear range of the conversion curve; and transmitting the first input signal, and converting the first input signal into a first output data stream.

8. The analog-to-digital conversion method according to claim 7, wherein the step of obtaining the conversion curve by using the test data stream and determining whether to adjust the offset control information according to the linear range of the conversion curve comprises:

recording a plurality of digital codes in the test data stream according to a plurality of analog voltages corresponding to the test signal to obtain the conversion curve;

detecting the linear range of the conversion curve to generate a regional information;

determining whether to generate an adjustment information according to the regional information;

when the adjustment information is generated, adjusting the offset control information according to the adjustment information; and when the adjustment information is not generated, maintaining the offset control information at an initial value.

9. The analog-to-digital conversion method according to claim 8, wherein the step of detecting the linear range of the conversion curve comprises:

determining whether at least one specific digital code among the digital codes does not appear or stay for over a predetermined time;

when the at least one specific digital code does not appear or stay for over the predetermined time, defining a first non-linear range of the conversion curve by using the at least one specific digital code;

determining whether the conversion curve has a negative slope;

when the conversion curve has the negative slope, defining a second non-linear range of the conversion curve by using the digital codes corresponding the negative slope among the digital codes; and defining the linear range of the conversion curve by using the first non-linear range and the second non-linear range.

10. The analog-to-digital conversion method according to claim 7 further comprising:

generating a reference data stream in the adjustment mode; and converting the reference data stream into the test signal.

11. The analog-to-digital conversion method according to claim 7 further comprising:

generating the test signal in the adjustment mode.

12. The analog-to-digital conversion method according to claim 7 further comprising:

in the operation mode, adjusting a DC level of a second input signal according to the offset control information to allow the second input signal to be within the linear range of the conversion curve;

transmitting the second input signal;

outputting one of the first input signal and the second input signal; and when the first input signal is output, converting the first input signal into the first output data stream; and when the second input signal is output, converting the second input signal into a second output data stream.

* * * * *